United States Patent
Pi et al.

(10) Patent No.: US 10,749,504 B2
(45) Date of Patent: Aug. 18, 2020

(54) CIRCUIT AND METHOD FOR AUTOMATICALLY CALIBRATING PHASE INTERPOLATOR

(71) Applicant: NEWCOSEMI (BEIJING) TECHNOLOGY CO., LTD., Beijing (CN)

(72) Inventors: Deyi Pi, Beijing (CN); Chang Liu, Beijing (CN)

(73) Assignee: NEWCOSEMI (BEIJING) TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/367,079

(22) Filed: Mar. 27, 2019

(65) Prior Publication Data

US 2020/0021277 A1    Jan. 16, 2020

(30) Foreign Application Priority Data

Jul. 12, 2018  (CN) .......................... 2018 1 0764491

(51) Int. Cl.
*H03L 7/06* (2006.01)
*H03K 3/011* (2006.01)
*H03K 5/01* (2006.01)
*H03K 5/00* (2006.01)

(52) U.S. Cl.
CPC .............. *H03K 3/011* (2013.01); *H03K 5/01* (2013.01); *H03K 2005/00286* (2013.01)

(58) Field of Classification Search
CPC ......... H03L 7/0891; H03L 7/18; H03L 7/093; H03L 7/087; H03L 7/10
USPC .................................................... 327/156, 158
See application file for complete search history.

(56) References Cited

U.S. PATENT DOCUMENTS

| | | | |
|---|---|---|---|
| 6,404,247 B1* | 6/2002 | Wang | H03L 7/0814 327/105 |
| 6,847,241 B1* | 1/2005 | Nguyen | H03L 7/0814 327/158 |
| 2017/0237444 A1* | 8/2017 | Wei | H03L 7/0814 327/156 |
| 2019/0058481 A1* | 2/2019 | Gao | H03L 7/18 |

* cited by examiner

*Primary Examiner* — Anh Q Tra
(74) *Attorney, Agent, or Firm* — Workman Nydegger

(57) ABSTRACT

A circuit and a method for automatically calibrating a phase interpolator are provided. Phase information of a reference clock signal and an output clock signal are processed by a phase detector to detect a phase difference of the two clock signals. A difference value between the phase difference and a standard phase difference corresponding to the digital control code is obtained, to generate compensation information. The compensation information is sent to the phase interpolator control unit for storage. When the phase interpolator operates normally, a phase interpolator control unit generates a control signal based on the compensation information, to regulate the phase value of the output clock signal of the phase interpolator.

4 Claims, 3 Drawing Sheets

CIRCUIT AND METHOD FOR AUTOMATICALLY CALIBRATING PHASE INTERPOLATOR

CROSS REFERENCE TO RELATED APPLICATION

The present application claims priority to Chinese Patent Application No. 201810764491.5, titled "CIRCUIT AND METHOD FOR AUTOMATICALLY CALIBRATING PHASE INTERPOLATOR", filed on Jul. 12, 2018 with the Chinese Patent Office, which is incorporated herein by reference in its entirety.

FIELD

The present disclosure relates to the technical field of circuit design, and particularly to a circuit and a method for automatically calibrating a phase interpolator.

BACKGROUND

In the technical field of circuit design, phase interpolators (PI) are widely used in integrated circuits because of high precision and phase controllability of their output clock signals. With the increase of the speed of the mixed signal circuit, the requirement for the precision of a PI circuit is continuously increased. Generally, in a PI, the influences of process variation, parasitic capacitance and parasitic resistance on the circuit cannot be neglected, which often result in phase deviation of the output signal, and thus affect the PI precision.

In conventional technology, PI calibration usually depends on an off-chip component. In small batch of process verification test or mass use, a PI cannot perform self-calibration. The precision loss caused by the change of process, current and temperature cannot be compensated, which affects the accuracy of the output clock signal of the PI.

SUMMARY

A circuit and a method for automatically calibrating a phase interpolator are provided according to embodiments of the present disclosure, to solve the technical problem that an output clock signal of a phase interpolator in the conventional technology is inaccurate because a phase interpolator cannot perform self-calibration and thus cannot compensate precision loss caused by change of process, current and temperature.

In view of the above, the following technical solutions are provided according to the present disclosure.

A circuit for automatically calibrating a phase interpolator includes a phase interpolator, a phase detector, a phase interpolator calibration unit, and a phase interpolator control unit.

The phase interpolator is connected with the phase detector and the phase interpolator control unit, the phase interpolator calibration unit is connected with the phase interpolator control unit, and the phase detector is connected with the phase interpolator calibration unit.

The phase interpolator is configured to receive a reference clock signal, and control an output phase by a digital control code to generate an output clock signal.

The phase detector is configured to detect a phase difference between the reference clock signal and the output clock signal of the phase interpolator, and send the phase difference to the phase interpolator calibration unit.

The phase interpolator calibration unit is configured to obtain a difference value between the phase difference and a standard phase difference corresponding to the digital control code, generate compensation information based on the difference value, and send the compensation information to the phase interpolator control unit for storage.

The phase interpolator control unit is configured to generate, when the phase interpolator operates normally, a control signal based on the compensation information, to regulate a phase value of the output clock signal of the phase interpolator.

Further, the phase interpolator may include an input end, a control end and an output end. The phase detector may include a first input end, a second input end and an output end. The phase interpolator calibration unit may include an input end and an output end. The phase interpolator control unit may include an input end and an output end.

The input end of the phase interpolator may be configured to receive the reference clock signal, and the control end of the phase interpolator may be connected with the output end of the phase interpolator control unit.

The first input end of the phase detector may be configured to receive the reference clock signal. The second input end of the phase detector may be connected with the output end of the phase interpolator, and configured to receive the output clock signal of the phase interpolator. The output end of the phase detector may be connected with the input end of the phase interpolator calibration unit.

The output end of the phase interpolator calibration unit may be connected with the input end of the phase interpolator control unit. The phase interpolator calibration unit may send the compensation information to the phase interpolator control unit for storage.

Further, the phase interpolator may also be connected with the phase interpolator calibration unit. The phase interpolator calibration unit may send the compensation information to the phase interpolator and the phase interpolator control unit for storage, or send the compensation information to the phase interpolator control unit for storage.

Further, the phase interpolator may include an input end, a first control end, a second control end and an output end. The phase detector may include a first input end, a second input end and an output end. The phase interpolator calibration unit may include an input end and an output end. The phase interpolator control unit may include an input end and an output end.

The input end of the phase interpolator may receive the reference clock signal, and the first control end of the phase interpolator may be connected with the output end of the phase interpolator control unit.

The first input end of the phase detector may receive the reference clock signal. The second input end of the phase detector may be connected with the output end of the phase interpolator, and may receive the output clock signal of the phase interpolator. The output end of the phase detector may be connected with the input end of the phase interpolator calibration unit.

The output end of the phase interpolator calibration unit may be connected with the second control end of the phase interpolator and the input end of the phase interpolator control unit. The phase interpolator calibration unit may send the compensation information to the phase interpolator and the phase interpolator control unit for storage, or send the compensation information to the phase interpolator control unit for storage.

Further, the phase difference is a difference value between a phase value of the reference clock signal and the phase value of the output clock signal of the phase interpolator.

Further, the phase interpolator may control current, resistance and capacitance of the phase interpolator by the digital control code to generate a phase of the output clock signal.

A method for automatically calibrating a phase interpolator includes:

receiving a reference clock signal, and controlling an output phase by a digital control code to generate an output clock signal of the phase interpolator;

detecting a phase difference between the reference clock signal and the output clock signal of the phase interpolator;

obtaining a difference value between the phase difference and a standard phase difference corresponding to the digital control code;

generating the compensation information based on the difference value; and storing the compensation information; and generating, when the phase interpolator operates normally, a control signal based on the compensation information, to regulate a phase value of the output clock signal of the phase interpolator.

According to the above technical solution, the circuit and the method for automatically calibrating the phase interpolator according to the present disclosure, compared with the conventional technology, the phase information of the reference clock signal and the output clock signal are processed by the phase detector to detect the phase difference of the two clock signals. The difference value between the phase difference and a standard phase difference corresponding to the digital control code is obtained, and then the compensation information which is used for achieving the consistency with the phase value of the ideal phase is generated. The compensation information is sent to the phase interpolator control unit for storage. When the phase interpolator operates normally, the phase interpolator control unit generates the control signal based on the compensation information, to regulate the phase value of the output clock signal of the phase interpolator, so as to correct the phase value of the output clock signal of the phase interpolator to reach or approach the ideal phase. Therefore, the phase interpolator generates a specified output phase, improving the accuracy of the output signal effectively.

BRIEF DESCRIPTION OF THE DRAWINGS

For explaining technical solutions according to embodiments of the disclosure more clearly, drawings used in the illustration of the embodiments of the disclosure are described briefly. Apparently, the drawings in the following description are merely some of the embodiments of the disclosure, and other drawings may be obtained based on the drawings by those skilled in the art without creative efforts.

DETAILED DESCRIPTION OF THE EMBODIMENTS

The technical solution according to the embodiments of the present disclosure will be described clearly and completely as follows in conjunction with the drawings. It is apparent that the described embodiments are only a few rather than all of the embodiments according to the present disclosure. Any other embodiments obtained by those skilled in the art based on the embodiments in the present disclosure without any creative work fall in the scope of the present disclosure.

According to the present disclosure, a phase interpolator can be automatically calibrated on chips in different environments. A phase detector (PD), a phase interpolator calibration unit, and a phase interpolator control unit are included. Based on phase values of output clock signals of the phase interpolator under different digital control codes, a difference value between a phase value of a reference clock signal and a phase value of the output clock signal is obtained by the phase detector. Then, a difference value between the phase difference and a standard phase difference corresponding to the digital control code is obtained, and then stored and used for compensation, such that the phase value of the output clock signal is regulated when the phase interpolator operates, so as to be corrected to reach or approach the ideal phase, thereby improving accuracy of the output clock signal of the phase interpolator.

Figure 1:
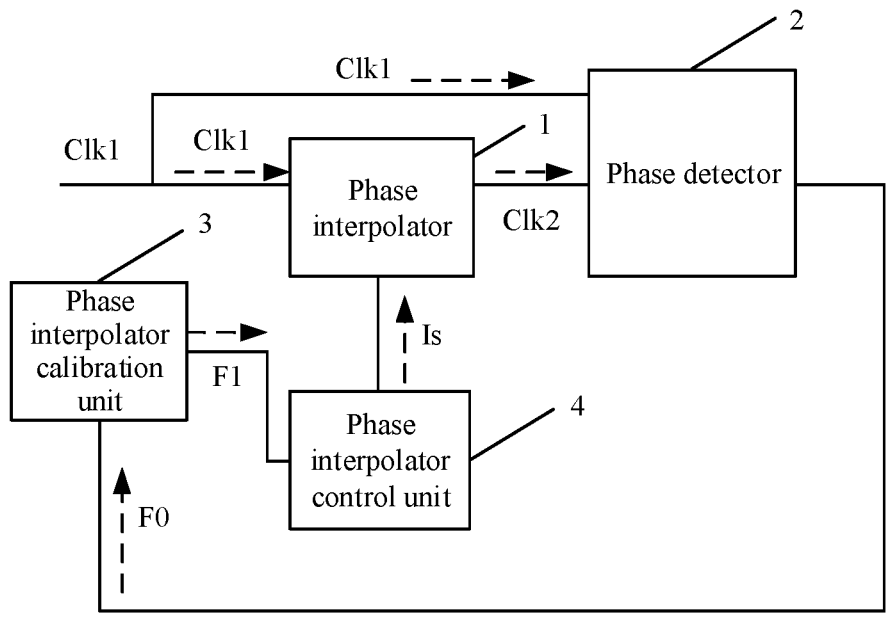
FIG. 1 is a schematic view of a circuit for automatically calibrating a phase interpolator according to an embodiment of the present disclosure.

As illustrated in FIG. 1, a circuit for automatically calibrating a phase interpolator is provided according to an embodiment of the present disclosure. The circuit includes a phase interpolator 1, a phase detector 2, a phase interpolator calibration unit 3, and a phase interpolator control unit 4.

The phase interpolator 1 is connected with the phase detector 2 and the phase interpolator control unit 4, the phase interpolator calibration unit 3 is connected with the phase interpolator control unit 4, and the phase detector 2 is connected with the phase interpolator calibration unit 3.

The phase interpolator 1 receives a reference clock signal Clk1, and controls an output phase by a digital control code to generate an output clock signal Clk2.

The phase detector 2 detects a phase difference F0 between the reference clock signal Clk1 and the output clock signal Clk2 of the phase interpolator, and sends the phase difference F0 to the phase interpolator calibration unit 3.

The phase interpolator calibration unit 3 obtains a difference value between the phase difference F0 and a standard phase difference corresponding to the digital control code, generates compensation information F1 that is used for achieving consistency with a phase value of the ideal phase based on the difference value, and sends the compensation information F1 to the phase interpolator control unit for storage.

The phase interpolator control unit 4 generates, when the phase interpolator 1 operates normally, a control signal Is based on the compensation information F1, to regulate the phase value of the output clock signal Clk2 of the phase interpolator 1, so as to correct the phase value of the output clock signal Clk2 of the phase interpolator 1 to reach or approach the ideal phase.

Figure 2:
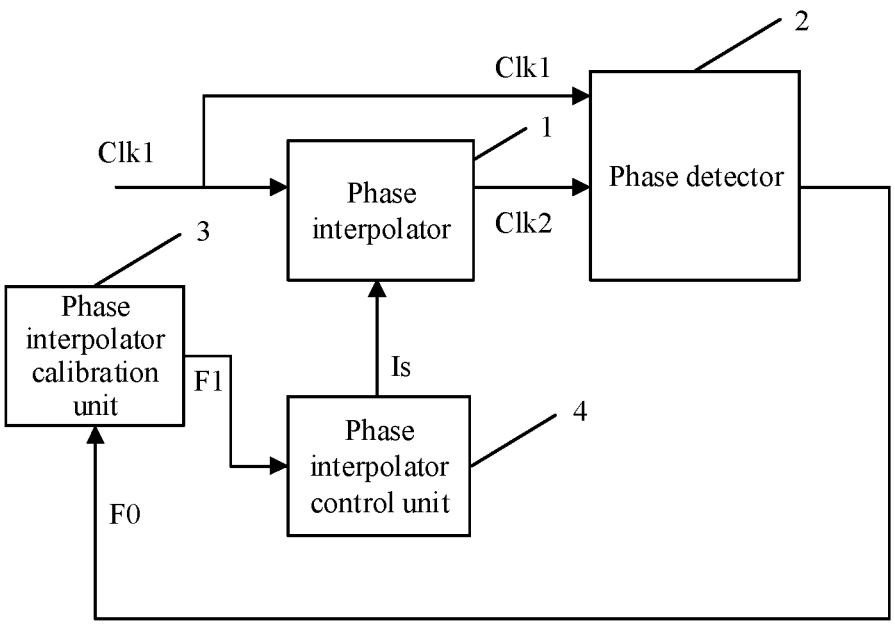
FIG. 2 is a diagram showing a signal flow of a circuit for automatically calibrating a phase interpolator according to an embodiment of the present disclosure.

Further, FIG. 2 illustrates a structure of the circuit for automatically calibrating the phase interpolator. The phase interpolator 1 includes an input end, a control end and an output end. The phase detector 2 includes a first input end, a second input end and an output end. The phase interpolator calibration unit 3 includes an input end and an output end. The phase interpolator control unit 4 includes an input end and an output end.

The input end of the phase interpolator 1 receives the reference clock signal Clk1. The control end of the phase interpolator 1 is connected with the output end of the phase interpolator control unit 4.

The first input end of the phase detector 2 receives the reference clock signal Clk1. The second input end of the phase detector 2 is connected with the output end of the phase interpolator 1, to receive the output clock signal Clk2 of the phase interpolator 1. The output end of the phase detector 2 is connected with the input end of the phase interpolator calibration unit 3.

The output end of the phase interpolator calibration unit 3 is connected with the input end of the phase interpolator control unit 4. The phase interpolator calibration unit sends the compensation information F1 to the phase interpolator control unit 4 for storage.

It should be noted that the phase difference is a difference value between the phase value of the reference clock signal and the phase value of the output clock signal of the phase interpolator. The phase interpolator 1 above may control current, resistance and capacitance of the phase interpolator by a digital control code to generate a phase of the output clock signal of the phase interpolator.

In the embodiment, the reference clock signal Clk1 is inputted to the phase interpolator 1. The phase interpolator 1 controls the output phase by the digital control code to generate the output clock signal Clk2. The reference clock signal Clk1 and the output clock signal Clk2 of the phase interpolator 1 are both inputted to the phase detector 2. The phase detector 2 detects the phase difference F0 between the reference clock signal Clk1 and the output clock signal Clk2. The phase interpolator calibration unit 3 obtains the difference value between the phase difference F0 and a standard phase difference corresponding to the digital control code, to generate the compensation information F1 which is used for achieving the consistency with the phase value of the ideal phase. The compensation information F1 is sent to the phase interpolator control unit for storage.

When the phase interpolator operates normally, the phase interpolator control unit generates the control signal Is based on the compensation information F1, to regulate the phase value of the output clock signal Clk2 of the phase interpolator, so as to correct the phase value of the output clock signal of the phase interpolator to reach or approach the ideal phase. Therefore, the output clock signal Clk2 is in consistency with the ideal phase output of the phase interpolator. In this way, the phase interpolator generates a specified output phase in normal operation, improving the accuracy of the output signal effectively.

In the circuit for automatically calibrating a phase interpolator according to the embodiment of the present disclosure, the phase information of the reference clock signal and the output clock signal of the phase interpolator are processed by the phase detector to detect the phase difference of the two clock signals. The difference value between the phase difference and a standard phase difference corresponding to the digital control code is obtained, to generate the compensation information which is used for achieving the consistency with the phase value of the ideal phase. The compensation information is sent to the phase interpolator control unit for storage. When the phase interpolator operates normally, the phase interpolator control unit generates the control signal based on the compensation information, to regulate the phase value of the output clock signal of the phase interpolator, so as to correct the phase value of the output clock signal of the phase interpolator to reach or approach the ideal phase. Therefore, the phase interpolator generates a specified output phase, improving the accuracy of the output signal effectively.

Figure 3:
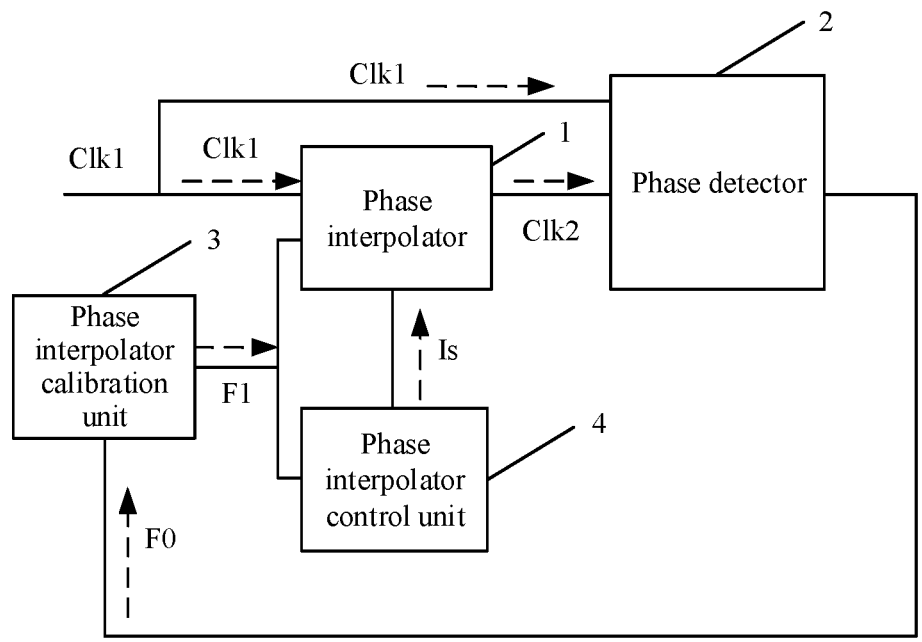
FIG. 3 is a schematic view of a circuit for automatically calibrating a phase interpolator according to another embodiment of the present disclosure.

As illustrated in FIG. 3, another circuit for automatically calibrating a phase interpolator is provided according to an embodiment of the present disclosure. The circuit includes a phase interpolator 1, a phase detector 2, a phase interpolator calibration unit 3 and a phase interpolator control unit 4.

The phase interpolator 1 is connected with the phase detector 2, the phase interpolator calibration unit 3 and the phase interpolator control unit 4. The phase interpolator calibration unit 3 is connected with the phase interpolator control unit 4. The phase detector 2 is connected with the phase interpolator calibration unit 3.

The phase interpolator 1 is configured to receive a reference clock signal Clk1, and control an output phase by a digital control code to generate an output clock signal Clk2.

The phase detector 2 detects a phase difference F0 between the reference clock signal Clk1 and the output clock signal Clk2 of the phase interpolator, and sends the phase difference F0 to the phase interpolator calibration unit 3.

The phase interpolator calibration unit 3 obtains a difference value between the phase difference F0 and a standard phase difference corresponding to the digital control code, generates compensation information F1 that is used for achieving consistency with a phase value of the ideal phase based on the difference value, and sends the compensation information F1 to the phase interpolator 1 and the phase interpolator control unit 4 for storage, or sends the compensation information F1 to the phase interpolator control unit for storage.

The phase interpolator control unit 4 generates, when the phase interpolator 1 operates normally, a control signal Is based on the compensation information F1, to regulate the phase value of the output clock signal Clk2 of the phase interpolator 1, so as to correct the phase value of the output clock signal Clk2 of the phase interpolator 1 to reach or approach the ideal phase.

Figure 4:
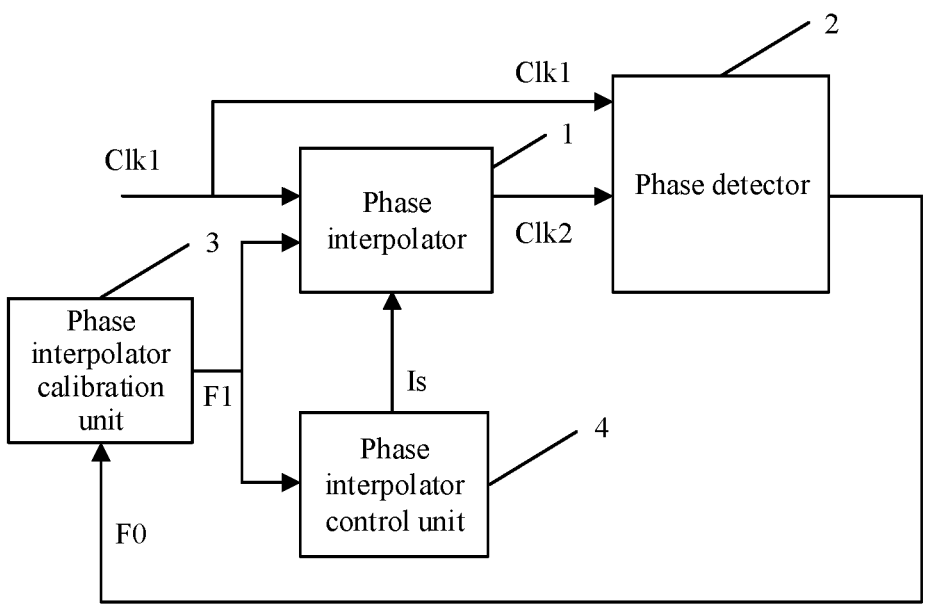
FIG. 4 is a diagram showing a signal flow of a circuit for automatically calibrating the phase interpolator according to another embodiment of the present disclosure.

Further, FIG. 4 illustrates a structure of the circuit for automatically calibrating the phase interpolator. The phase interpolator 1 includes an input end, a first control end, a second control end and an output end. The phase detector 2 includes a first input end, a second input end and an output end. The phase interpolator calibration unit 3 includes an input end and an output end. The phase interpolator control unit 4 includes an input end and an output end.

The input end of the phase interpolator 1 receives a reference clock signal Clk1. The first control end of the phase interpolator 1 is connected with the output end of the phase interpolator control unit 4.

The first input end of the phase detector 2 receives the reference clock signal Clk1. The second input end of the phase detector 2 is connected with the output end of the phase interpolator 1, to receive the output clock signal Clk2 of the phase interpolator 1. The output end of the phase detector 2 is connected with the input end of the phase interpolator calibration unit 3.

The output end of the phase interpolator calibration unit 3 is connected with the second control end of the phase interpolator 1 and the input end of the phase interpolator control unit 4. The phase interpolator calibration unit sends the compensation information F1 to the phase interpolator 1 and the phase interpolator control unit 4 for storage, or sends the compensation information F1 to the phase interpolator control unit 4 for storage.

It should be noted that the phase difference is a difference value between the phase value of the reference clock signal and the phase value of the output clock signal of the phase interpolator. The phase interpolator 1 above may control current, resistance and capacitance of the phase interpolator by the digital control code to generate a phase of the output clock signal.

In this embodiment, the reference clock signal Clk1 is inputted to the phase interpolator 1. The phase interpolator 1 controls the output phase by the digital control code to generate the output clock signal Clk2. The reference clock signal Clk1 and the output clock signal Clk2 of the phase interpolator 1 are both inputted to the phase detector 2. The phase detector 2 detects the phase difference F0 between the reference clock signal Clk1 and the output clock signal Clk2. The phase interpolator calibration unit 3 obtains the difference value between the phase difference F0 and a standard phase difference corresponding to the digital control code, to generate the compensation information F1 which is used for achieving the consistency with the phase value of the ideal phase. The compensation information F1 is sent to the phase interpolator control unit and the phase interpolator for storage, or is sent to the phase interpolator control unit for storage.

When the phase interpolator operates normally, the phase interpolator control unit generates the control signal Is based on the compensation information F1, to regulate the phase value of the output clock signal Clk2 of the phase interpolator, so as to correct the phase value of the output clock signal of the phase interpolator to reach or approach the ideal phase. Therefore, the output clock signal Clk2 is in consistency with the ideal phase output of the phase interpolator. In this way, the phase interpolator generates a specified output phase in normal operation, improving the accuracy of the output signal effectively.

In the circuit for automatically calibrating a phase interpolator according to the embodiment of the present disclosure, the phase information of the reference clock signal and the output clock signal of the phase interpolator are processed by the phase detector to detect the phase difference of the two clock signals. The difference value between the phase difference and a standard phase difference corresponding to the digital control code is obtained, to generate the compensation information which is used for achieving the consistency with the phase value of the ideal phase. The compensation information is sent to the phase interpolator control unit and the phase interpolator for storage, or is sent to the phase interpolator control unit for storage. When the phase interpolator operates normally, the phase interpolator control unit generates the control signal based on the compensation information, to regulate the phase value of the output clock signal of the phase interpolator, so as to correct the phase value of the output clock signal of the phase interpolator to reach or approach the ideal phase. Therefore, the phase interpolator generates a specified output phase, improving the accuracy of the output signal effectively.

Figure 5:
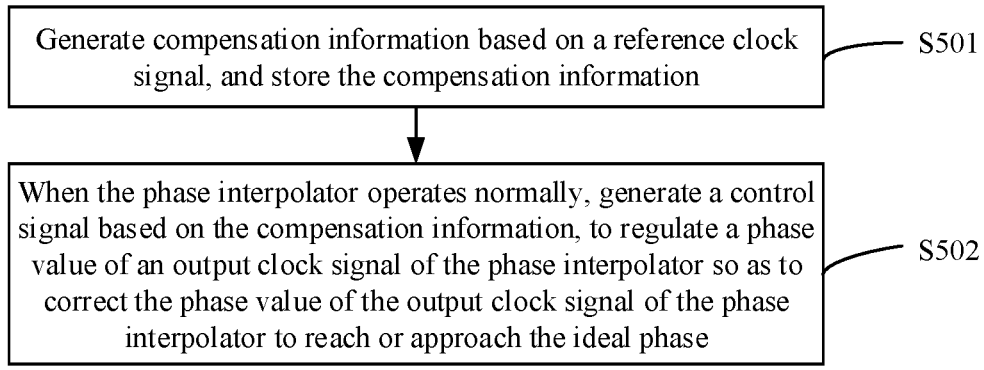
FIG. 5 is a flowchart of a method for automatically calibrating a phase interpolator according to an embodiment of the present disclosure.

As illustrated in FIG. 5, a method for automatically calibrating a phase interpolator is provided according to an embodiment of the present disclosure. The method includes the following steps S501 to S502.

In step S501, compensation information that is used for achieving consistency with a phase value of an ideal phase is generated based on a reference clock signal and is stored.

In the embodiment of the present disclosure, it should be noted that the phase interpolator is calibrated based on the reference clock signal Clk1 in advance, so as to make a phase of an output clock signal of the phase interpolator reach or approach an ideal phase.

Figure 6:
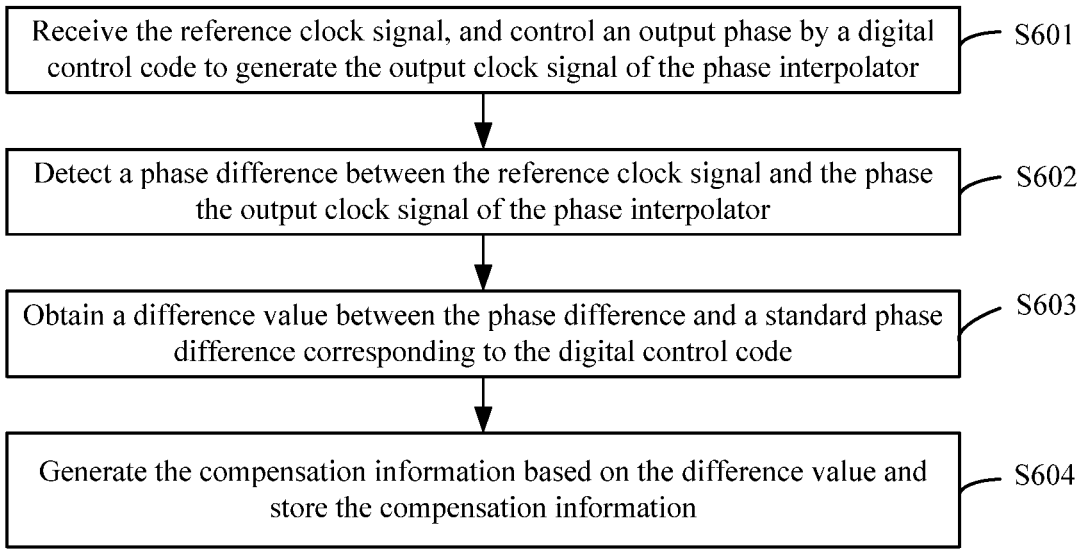
FIG. 6 is a flowchart of an implementation of step S501 according to an embodiment of the present disclosure.

As illustrated in FIG. 6, an implementation of the step S501 is provided according to an embodiment of the present disclosure.

The step of generating and storing the compensation information that is used for achieving consistency with the phase value of the ideal phase based on the reference clock signal includes the following steps S601 to S604.

In step S601, the reference clock signal is received, an output phase is controlled by a digital control code to generate the output clock signal of the phase interpolator.

In step S602, a phase difference between the reference clock signal and the output clock signal of the phase interpolator is detected.

In step S603, a difference value between the phase difference and a standard phase difference corresponding to the digital control code is obtained.

In step S604, the compensation information that is used for achieving consistency with the phase value of the ideal phase is generated based on the difference value and is stored.

In step S502, when the phase interpolator operates normally, a control signal is generated based on the compensation information, to regulate the phase value of the output clock signal of the phase interpolator, so as to correct the phase value of the output clock signal of the phase interpolator to reach or approach the ideal phase.

It should be noted that, the phase interpolator is calibrated based on the reference clock signal. The compensation information obtained by calibrating the phase interpolator is stored in the phase interpolator and the phase interpolator control unit, or stored in the phase interpolator control unit. When the phase interpolator operates normally, the phase interpolator performs compensation of the phase based on the stored compensation information to correct the phase value of the output clock signal of the phase interpolator to reach or approach the ideal phase.

In the method for automatically calibrating the phase interpolator provided according to the embodiment of the present disclosure, the phase information of the reference clock signal and the output clock signal of the phase interpolator are processed by the phase detector to detect the phase difference of the two clock signals. The difference value between the phase difference and a standard phase difference corresponding to the digital control code is obtained, to generate and store the compensation information which is used for achieving the consistency with the phase value of the ideal phase. When the phase interpolator operates normally, the phase interpolator control unit generates the control signal based on the compensation information, to regulate the phase value of the output clock signal of the phase interpolator, so as to correct the phase value of the output clock signal of the phase interpolator to reach or approach the ideal phase. Therefore, the phase interpolator generates a specified output phase, improving the accuracy of the output signal effectively.

It should be noted that the embodiments in this specification are all described in a progressive manner. Description of each of the embodiments focuses on differences from other embodiments, and reference may be made to each other for the same or similar parts among respective embodiments.

The circuit and the method provided in the present disclosure are described in conjunction with the above drawings, and the description of the above embodiments is only used to help understand the core idea of the present disclosure. For those skilled in the art, according to the spirit of the present disclosure, there may be changes in specific implementations and application scope. From the above, the content in the specification should not be understood as limitations of the present disclosure.

The above description of the embodiments herein enables those skilled in the art to implement or use the present disclosure. Numerous modifications to the embodiments are apparent to those skilled in the art, and the general principles defined herein can be implemented in other embodiments without deviating from the spirit or scope of the present disclosure. Therefore, the present disclosure is not limited to the embodiments described herein, but is to conform to the widest scope consistent with the principles and novel features disclosed herein.

The invention claimed is:

1. A circuit for automatically calibrating a phase interpolator, comprising:
   the phase interpolator,
   a phase detector,
   a phase interpolator calibration unit, and
   a phase interpolator control unit, wherein,
   the phase interpolator is connected with the phase detector and the phase interpolator control unit, the phase interpolator calibration unit is connected with the phase interpolator control unit, the phase detector is connected with the phase interpolator calibration unit;
   the phase interpolator is configured to receive a reference clock signal, and control an output phase by a digital control code to generate an output clock signal;
   the phase detector is configured to detect a phase difference between the reference clock signal and the output clock signal of the phase interpolator and send the phase difference to the phase interpolator calibration unit;
   the phase interpolator calibration unit is configured to obtain a difference value between the phase difference and a standard phase difference corresponding to the digital control code, generate compensation information based on the difference value, and send the compensation information to the phase interpolator control unit for storage;
   the phase interpolator control unit is configured to generate, when the phase interpolator operates normally, a control signal based on the compensation information, to regulate a phase value of the output clock signal of the phase interpolator;
   the phase interpolator is also connected with the phase interpolator calibration unit; and
   the phase interpolator calibration unit is configured to send the compensation information to the phase interpolator and the phase interpolator control unit for storage, or send the compensation information to the phase interpolator control unit for storage.

2. The circuit according to claim 1, wherein,
   the phase interpolator comprises an input end, a first control end, a second control end and an output end;
   the phase detector comprises a first input end, a second input end and an output end;
   the phase interpolator calibration unit comprises an input end and an output end;
   the phase interpolator control unit comprises an input end and an output end;
   the input end of the phase interpolator is configured to receive the reference clock signal, the first control end of the phase interpolator is connected with the output end of the phase interpolator control unit;
   the first input end of the phase detector is configured to receive the reference clock signal, the second input end of the phase detector is connected with the output end of the phase interpolator, and is configured to receive the output clock signal of the phase interpolator, the output end of the phase detector is connected with the input end of the phase interpolator calibration unit; and
   the output end of the phase interpolator calibration unit is connected with the second control end of the phase interpolator and the input end of the phase interpolator control unit, the phase interpolator calibration unit is configured to send the compensation information to the phase interpolator and the phase interpolator control unit for storage, or send the compensation information to the phase interpolator control unit for storage.

3. The circuit according to clam 1, wherein, the phase difference is a difference value between a phase value of the reference clock signal and the phase value of the output clock signal of the phase interpolator.

4. The circuit according to claim 1, wherein the phase interpolator is configured to control current, resistance and capacitance of the phase interpolator by the digital control code to generate a phase of the output clock signal.

* * * * *